US012053971B2

(12) United States Patent
Kim et al.

(10) Patent No.: US 12,053,971 B2
(45) Date of Patent: Aug. 6, 2024

(54) DISPLAY DEVICE

(71) Applicant: Samsung Display Co., Ltd., Yongin-si (KR)

(72) Inventors: Tae-Chang Kim, Anyang-si (KR); Chanhui Han, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 432 days.

(21) Appl. No.: 17/329,916

(22) Filed: May 25, 2021

(65) Prior Publication Data
US 2022/0046811 A1 Feb. 10, 2022

(30) Foreign Application Priority Data

Aug. 4, 2020 (KR) .................. 10-2020-0097610

(51) Int. Cl.
| | |
|---|---|
| *B32B 7/12* | (2006.01) |
| *B32B 3/16* | (2006.01) |
| *B32B 3/30* | (2006.01) |
| *B32B 5/18* | (2006.01) |
| *B32B 7/022* | (2019.01) |
| *H05K 5/02* | (2006.01) |

(52) U.S. Cl.
CPC .................. *B32B 7/12* (2013.01); *B32B 3/16* (2013.01); *B32B 3/30* (2013.01); *B32B 5/18* (2013.01); *B32B 7/022* (2019.01); *H05K 5/0217* (2013.01); *B32B 2307/51* (2013.01); *B32B 2457/20* (2013.01)

(58) Field of Classification Search
CPC .. B32B 7/022; B32B 7/12; B32B 3/16; B32B 3/30; B32B 5/18; B32B 2307/51; B32B 2457/20; H05K 5/0217; G06F 1/1652
See application file for complete search history.

(56) References Cited

U.S. PATENT DOCUMENTS 10,111,346 B2 10/2018 Seo et al.

FOREIGN PATENT DOCUMENTS

| KR | 10-2014-0012392 | 2/2014 |
| KR | 10-2018-0030301 | 3/2018 |
| KR | 10-2019-0091711 | 8/2019 |
| KR | 10-2019-0106322 | 9/2019 |

*Primary Examiner* — Catherine A. Simone
(74) *Attorney, Agent, or Firm* — KILE PARK REED & HOUTTEMAN PLLC

(57) ABSTRACT

A display device includes a display module; a support plate; the support plate including support bars; an opening defined between the support bars adjacent to each other; and a first support portion and a second support portion spaced apart from each other, the support bars being disposed between the first support portion and the second support portion; a support film disposed between the display module and the support plate; and a foam layer disposed on at least one of a first upper surface and a first lower surface of the support film, the foam layer including a core layer having a first modulus and a first thickness; and a skin layer disposed on at least one of a second upper surface and a second lower surface of the core layer, having a second modulus greater than the first modulus, and having a second thickness smaller than the first thickness.

20 Claims, 12 Drawing Sheets

DISPLAY DEVICE

CROSS-REFERENCE TO RELATED APPLICATION(S)

This U.S. non-provisional patent application claims priority to and the benefit of Korean Patent Application No. 10-2020-0097610 under 35 U.S.C. § 119, filed on Aug. 4, 2020, the entire contents of which are incorporated herein by reference.

BACKGROUND

1. Technical Field

The disclosure relates to a display device. More particularly, the disclosure relates to a slidable display device.

2. Description of the Related Art

Electronic devices that provide an image to a user, such as a smartphone, a digital camera, a notebook computer, a navigation unit, and a smart television, include a display device to display the image. The display device generates the image and provides the image to the user through a display screen thereof.

In recent years, with the technological development of the display device, various types of display devices have been developed. For example, various flexible display devices, which are foldable or rollable, have been developed. The flexible display device that is capable of being transformed into various shapes is easy to carry and improves a user's convenience.

Among the flexible display devices, an expandable and flexible display device includes a flexible display module. The flexible display module is partially pulled out of a case as needed, and thus the flexible display module is expanded. However, a flexure is seen in a portion at which the flexible display module is expanded because of a lower structure of the expandable and flexible display device.

SUMMARY

The disclosure provides a display device capable of alleviating a flexure on a surface of a display module to improve a surface quality.

Embodiments of the disclosure provide a display device including a display module, a support plate disposed under the display module, the support plate including a plurality of support bars, an opening defined between the plurality of support bars adjacent to each other, and a first support portion and a second support portion spaced apart from each other, the plurality of support bars being disposed between the first support portion and the second support portion, a support film disposed between the display module and the support plate, and a foam layer disposed on at least one of a first upper surface and a first lower surface of the support film. The foam layer may include a core layer having a first modulus and a first thickness, and a skin layer disposed on at least one of a second upper surface and a second lower surface of the core layer, having a second modulus greater than the first modulus, and having a second thickness smaller than the first thickness. A ratio of the first thickness to the second thickness may be in a range of about 10:1 to about 35:1.

The foam layer may be disposed on the support film, the core layer may include a concave portion defined in the second lower surface to overlap the opening and recessed toward the display module, and the second upper surface may be a flat surface.

The display device may further include a first adhesive layer disposed between the support plate and the support film, and a second adhesive layer disposed between the foam layer and the display module.

The first adhesive layer may include a concave portion overlapping the opening and recessed toward the display module.

The foam layer may be disposed directly on the support film.

The foam layer may be disposed under the support film. Each of the second upper surface and the second lower surface may include a concave portion defined therein, overlapping the opening and recessed toward the display module. The first lower surface may include a concave portion defined therein, overlapping the opening and recessed toward the display module, and the first upper surface may be a flat surface.

The display device may further include a fourth adhesive layer disposed between the support film and the display module and a fifth adhesive layer disposed between the foam layer and the plurality of support bars.

The first thickness may be equal to or greater than about 80 μm and equal to or smaller than about 100 μm.

The second thickness may be equal to or greater than about 3 μm and equal to or smaller than about 8 μm.

The core layer may have a density equal to or greater than about 0.5 g/cm$^3$ and equal to or smaller than about 0.8 g/cm$^3$.

The second modulus may be equal to or greater than about 20 Mpa and equal to or smaller than about 24 Mpa at a temperature of about −20° C.

The foam layer may have a modulus that is equal to or greater than about 3 Mpa and equal to or smaller than about 5 Mpa at a temperature of about −20° C.

The core layer may include a base resin including a plurality of pores defined therein.

The core layer may include polyurethane, and the skin layer may include polyolefin.

Embodiments of the disclosure provide a display device including a display module, a support plate disposed under the display module, the support plate including a plurality of support bars spaced apart from each other, and a first support portion and a second support portion spaced apart from each other, the plurality of support bars being disposed between the first support portion and the second support portion, a support film disposed between the display module and the support plate, and a foam layer disposed on at least one of a first upper surface and a first lower surface of the support film, having a first modulus, and having a first thickness. The foam layer may include a core layer, and an upper skin layer disposed on at least one of a second upper surface and a second lower surface of the core layer, having a second modulus greater than the first modulus, and having a second thickness smaller than the first thickness. A ratio of the first thickness to the second thickness is in a range of about 10:1 to about 35:1, and the display device may be operated in a first mode or a second mode, and a display surface of the display device in the second mode is larger than in the first mode.

The display module may include a first area overlapping the first support portion. a second area overlapping the plurality of support bars, a third area overlapping the second support portion, and a size of the second area exposed to an outside increases in case that the first mode is changed to the second mode.

The second modulus may be equal to or greater than about 20 Mpa and equal to or smaller than about 24 Mpa at a temperature of about −20° C.

The foam layer may have a modulus that is equal to or greater than about 3 Mpa and equal to or smaller than about 5 Mpa at a temperature of about −20° C.

The core layer may include polyurethane, and the skin layer may include polyolefin.

The first thickness may be equal to or greater than about 80 μm and equal to or smaller than about 100 μm, and the second thickness may be equal to or greater than about 3 μm and equal to or smaller than about 8 μm.

According to the above, the display device may include the foam layer formed between the display module and the support bars, and thus the flexure observed from the outside in the area of the display module overlapping the support bars may be reduced. Thus, the surface quality of the display module may be improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
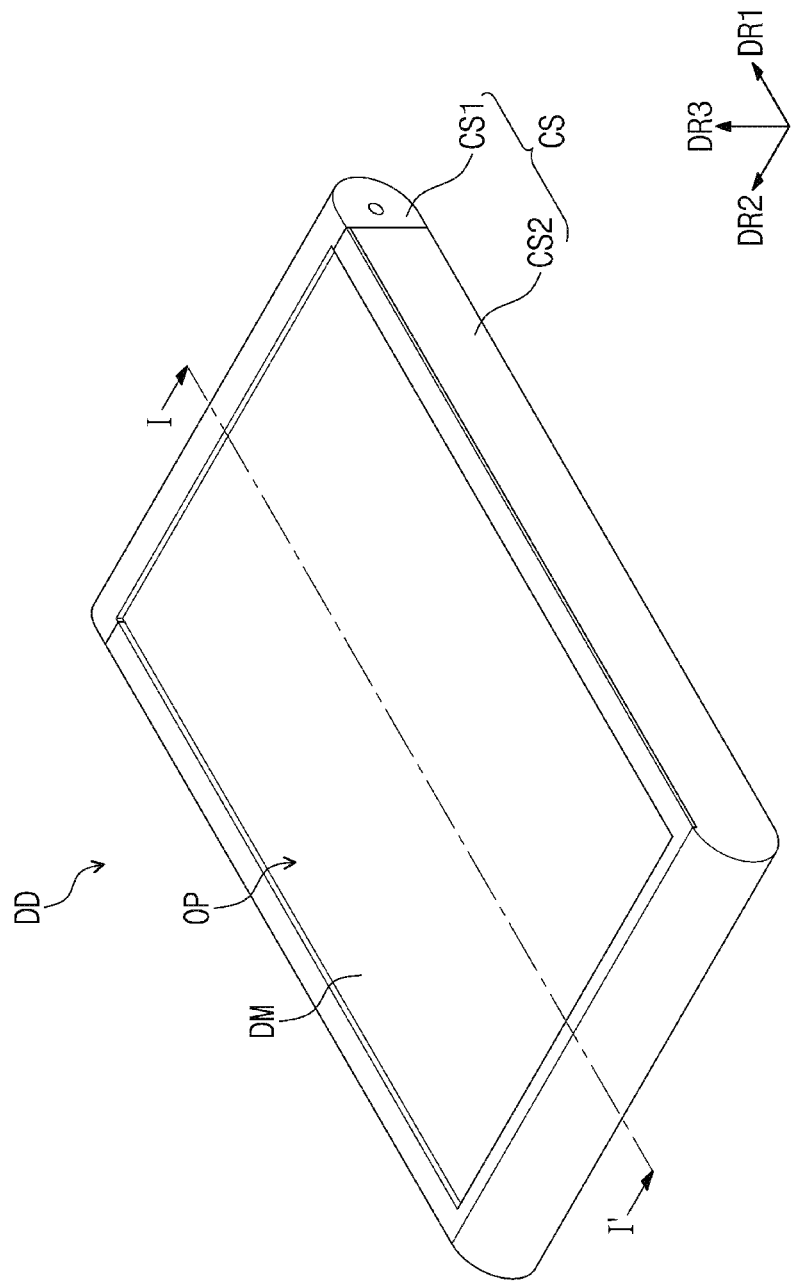
FIG. 1 is a schematic perspective view showing a display device in a first mode according to an embodiment of the disclosure.

The disclosure may be variously modified and realized in many different forms, and thus some embodiments will be described with reference to the drawings in detail hereinbelow. However, the disclosure should not be limited to the specific disclosed forms and be construed to include all modifications, equivalents, or replacements included in the spirit and scope of the disclosure.

In the disclosure, it will be understood that when an element or layer is referred to as being "on," "connected to," or "coupled to" another element or layer, it can be directly on, connected or coupled to the other element or layer or intervening elements or layers may be present.

Like numerals refer to like elements throughout. In the drawings, the thickness, ratio, and dimension of components may be exaggerated for effective description of the technical content.

As used herein, the term "and/or" includes any and all combinations of one or more of the associated listed items.

It will be understood that, although the terms first, second, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure. As used herein, the singular forms "a," "an," and "the" are intended to include the plural forms as well, unless the context clearly indicates otherwise.

It will be understood that when an element is placed "on" another element, it can be placed above or below another element.

Spatially relative terms, such as "beneath," "below," "lower," "above," "upper" and the like, may be used herein for ease of description to describe one element or feature's relationship to another element or feature as shown in the figures.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and will not be interpreted in an ideal or excessively formal sense unless clearly so defined herein.

It will be further understood that the terms "include" (or "comprise") and/or "including," when used in this specification, specify the presence of stated features, integers, steps, operations, elements, and/or components, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, the disclosure will be explained in detail with reference to the accompanying drawings.

Figure 2:
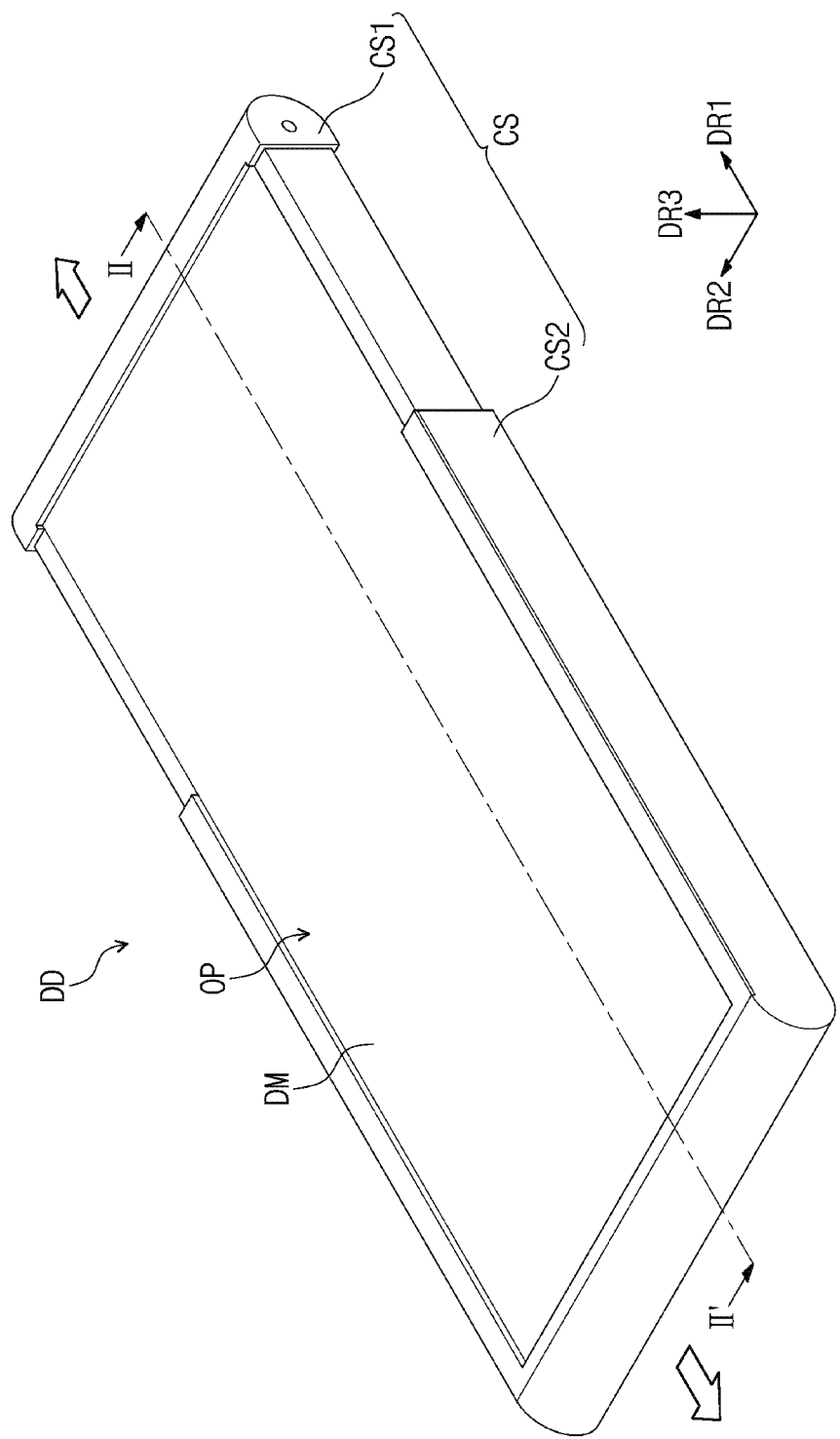
FIG. 2 is a schematic perspective view showing the display device in a second mode according to an embodiment of the disclosure.

FIG. 1 is a schematic perspective view showing a display device DD in a first mode according to an embodiment, and FIG. 2 is a schematic perspective view showing the display device DD in a second mode according to an embodiment.

Referring to FIG. 1, the display device DD may include a display module DM and a case CS accommodating the display module DM. The display module DM may be exposed to the outside through an opening OP defined in an upper portion of the case CS.

The case CS may include a first case CS1 and a second case CS2. The first case CS1 and the second case CS2 may be coupled or connected to each other to accommodate the display module DM. The first case CS1 may be connected to the second case CS2 to be able to move in a first direction DR1.

Hereinafter, a direction intersecting the first direction DR1 is referred to as a second direction DR2. A direction substantially perpendicular to a plane defined by the first direction DR1 and the second direction DR2 is referred to as a third direction DR3. In the disclosure, the expression "when viewed in a plane" or "in a plan view" may mean a state of being viewed from above in the third direction DR3. Front (or upper) and rear (or lower) surfaces of each member of the display device DD are distinguished from each other in the third direction DR3. Directions indicated by the first, second, and third directions DR1, DR2, and DR3 are relative to each other and may be changed to other directions.

Referring to FIG. 2, an area of an exposed surface of the display module DM, for example, a display surface exposed through the opening OP of the case CS, may be adjusted according to the movement of the first case CS1. For example, the display module DM may be a flexible display module and may be supported by a support plate SP (refer to FIG. 5) disposed under the display module DM. The support plate SP (refer to FIG. 5) may be connected to the first case CS1, and in case that the first case CS1 moves in the first direction DR1, the support plate SP (refer to FIG. 5) may move in the first direction DR1.

Although not shown in the drawings, a portion of the display module DM except for the portion of the display module DM, which is exposed through the opening OP, i.e., the display surface DS (refer to FIG. 5), may be disposed in the second case CS2. As the first case CS1 moves, a size of the opening OP increases in the first direction DR1. The display module DM disposed on the support plate SP (refer to FIG. 3) may move in the first direction DR1 together with the support plate SP (refer to FIG. 3) according to the movement of the first case CS1, and thus, the display surface DS of the display module DM exposed through the opening OP may be expanded. Accordingly, a user may view an image through a larger screen.

Figure 3:
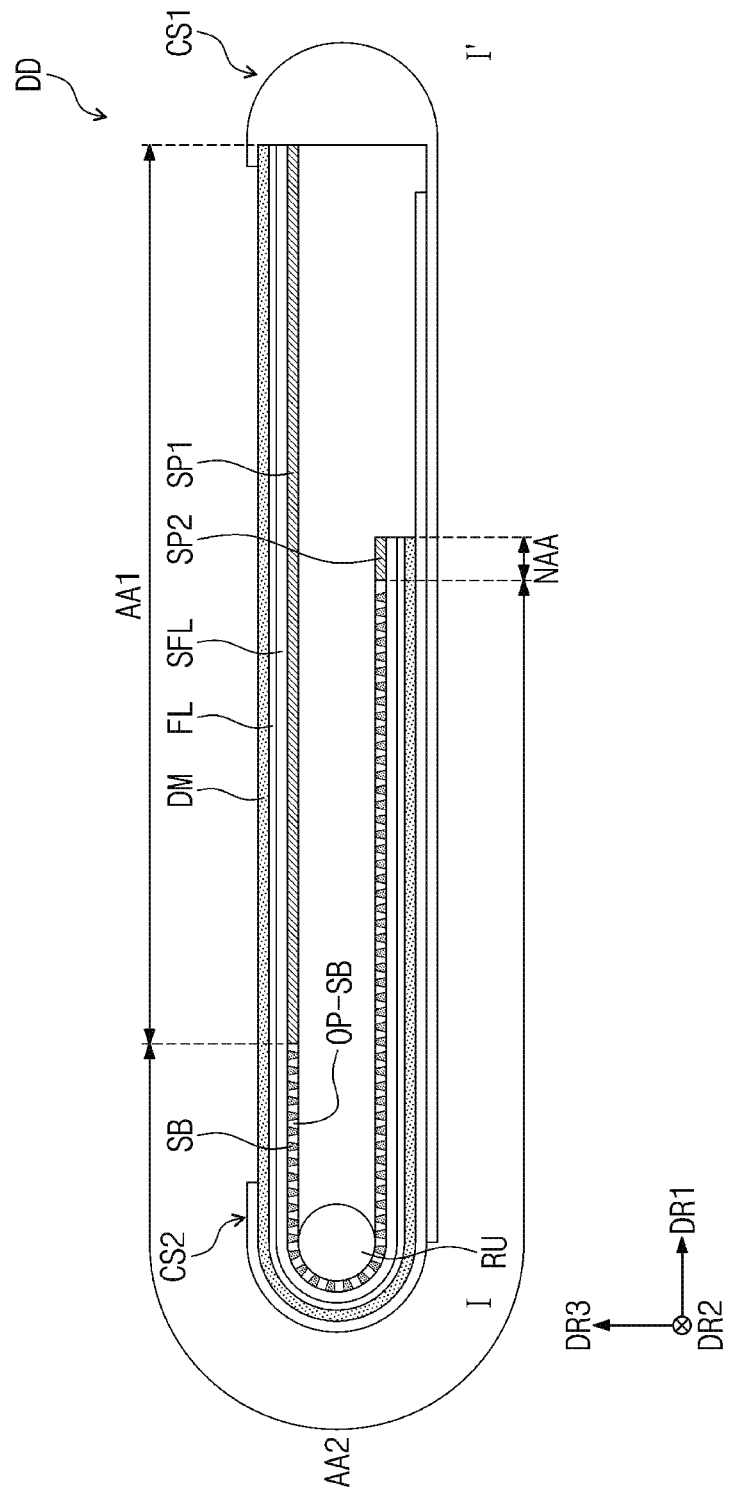
FIG. 3 is a schematic cross-sectional view taken along line I-I' to show the display device in the first mode of FIG. 1.
Figure 4:
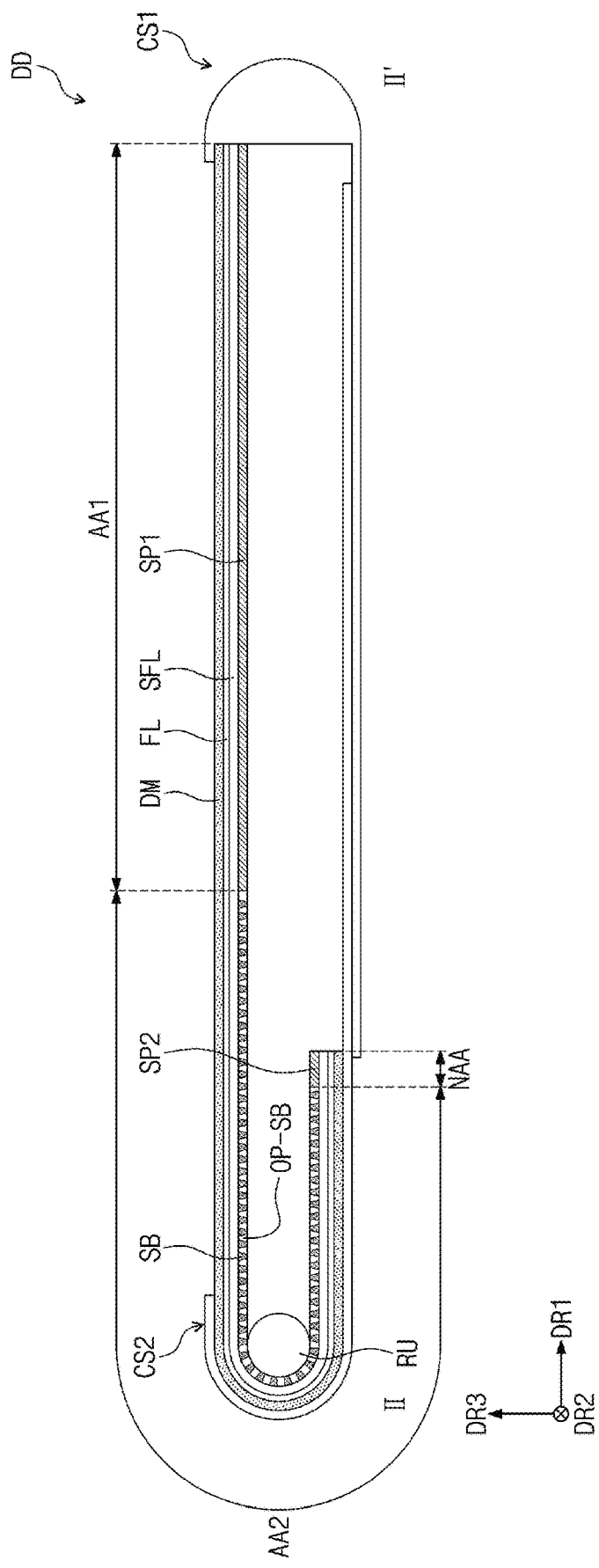
FIG. 4 is a schematic cross-sectional view taken along line II-II' to show the display device in the second mode of FIG. 2.

FIG. 3 is a schematic cross-sectional view taken along line I-I' to show the display device DD in the first mode of FIG. 1, and FIG. 4 is a schematic cross-sectional view taken along line II-II' to show the display device DD in the second mode of FIG. 2.

Referring to FIGS. 3 and 4, the display device DD may include the display module DM, the case CS accommodating the display module DM, a rotation unit RU, and the support plate SP moved by the rotation unit RU. The case CS may include the first case CS1 and the second case CS2. The first case CS1 and the second case CS2 may be connected to each other to accommodate the display module DM. The first case CS1 may be connected to the second case CS2 to be able to move in the first direction DR1.

The display device DD may include the support plate SP disposed between the display module DM and the case CS. The support plate SP may include a first support portion SP1, a second support portion SP2, and support bars SB disposed between the first support portion SP1 and the second support portion SP2. The first support portion SP1 and the second support portion SP2 may be substantially parallel to a plane defined by the first direction DR1 and the second direction DR2. The support plate SP may be provided with an opening OP-SB defined between the support bars SB adjacent to each other.

In case that the rotation unit RU is rotated, the support bars SB may move along a curved surface of the rotation unit RU. As a result, the first support portion SP1 may move in the first direction DR1, and the second support portion SP2 may move in a direction opposite to the first direction DR1.

The display module DM disposed on the support plate SP may include a first area AA1 overlapping the first support portion SP1, a second area AA2 overlapping the support bars SB, and a third area NAA overlapping the second support portion SP2.

In case that the first mode is changed to the second mode and the support plate SP moves, the display module DM disposed on the support plate SP may move. The first area AA1 may move in the first direction DR1, the second area AA2 may move along the curved surface of the rotation unit RU, and the third area NAA may move in the direction opposite to the first direction DR1. An area of a surface exposed to the outside in the second area AA2 may be greater in the second mode than in the first mode.

Figure 5:
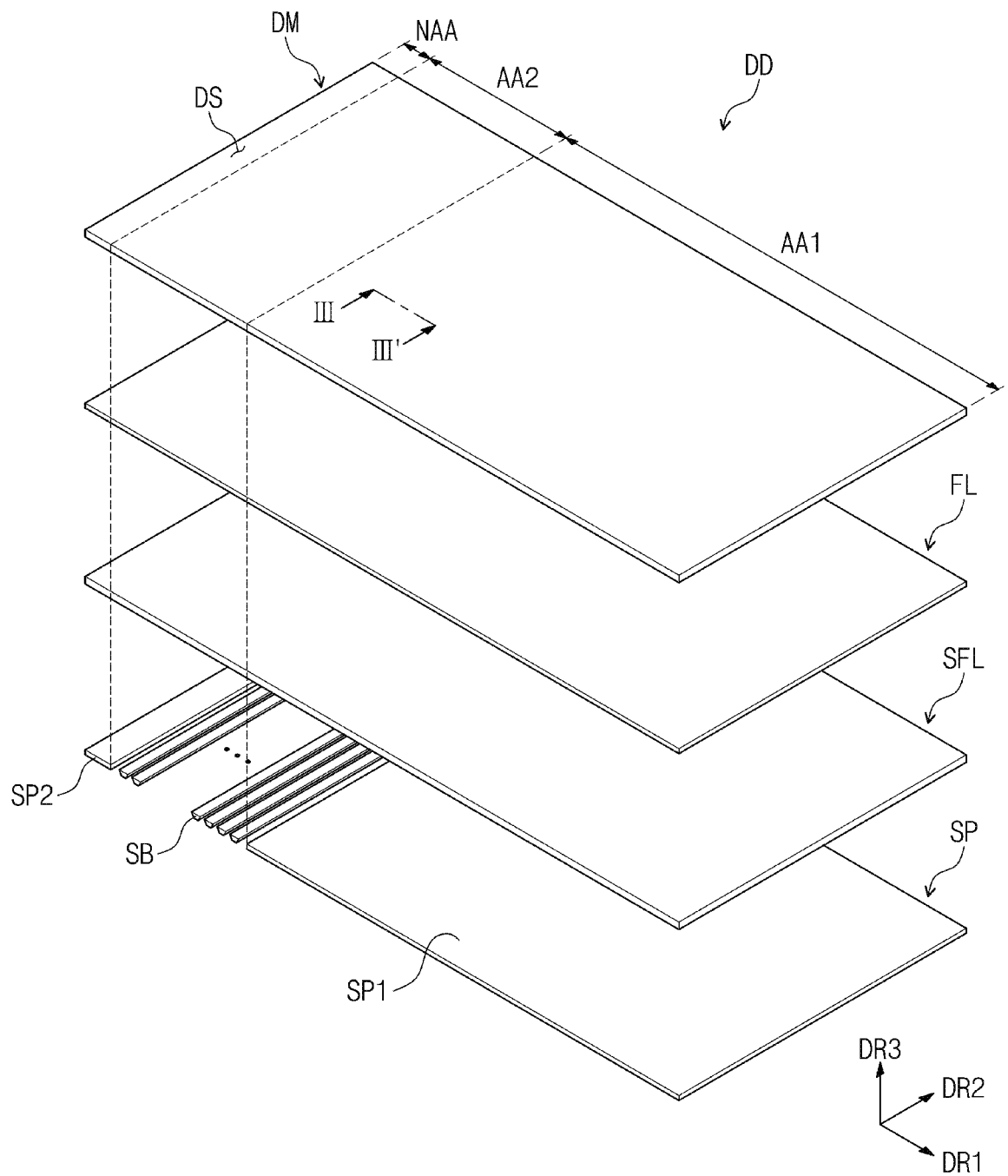
FIG. 5 is a schematic exploded perspective view showing the display device shown in FIG. 1.
Figure 6:
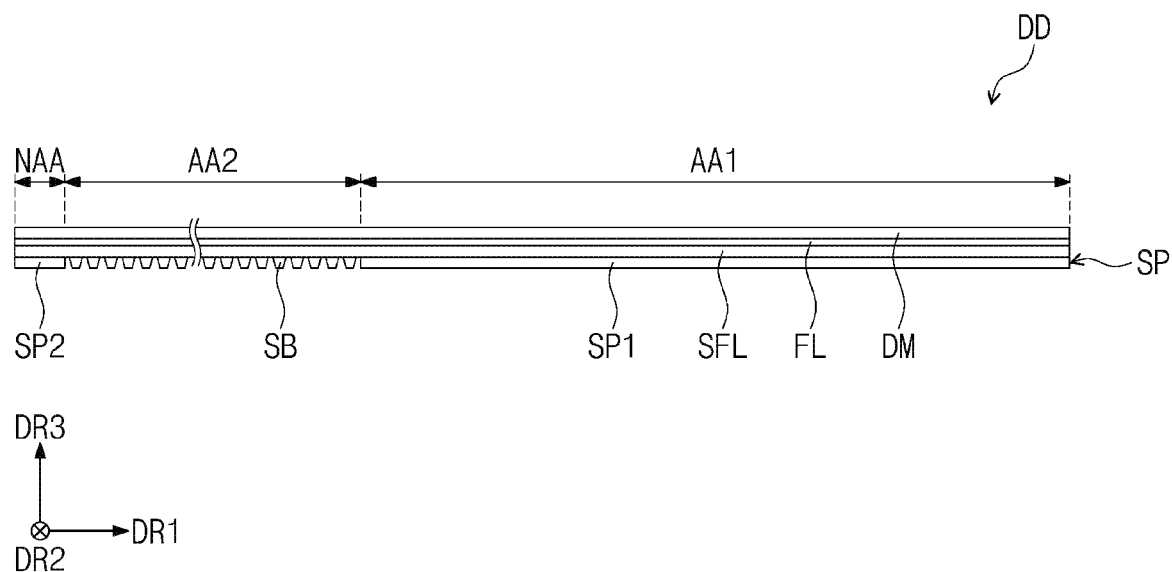
FIG. 6 is a schematic side view showing the display device shown in FIG. 5.

FIG. 5 is a schematic exploded perspective view showing the display device DD shown in FIG. 1, and FIG. 6 is a schematic side view showing the display device DD shown in FIG. 5. For the convenience of explanation, the case CS (refer to FIG. 1) and the rotation unit RU may be omitted in FIGS. 5 and 6, and a structure in which a foam layer FL is disposed on a support film SFL is shown as an example in FIGS. 5 and 6.

Referring to FIGS. 5 and 6, the display surface DS of the display module DM may include the first area AA1, the second area AA2, and the third area NAA. The first area AA1 of the display surface DS may be provided to have a size corresponding to the opening OP (refer to FIG. 1) of the case CS (refer to FIG. 1) in a default mode to determine a screen size in the default mode. For example, the opening OP (refer to FIG. 1) of the case CS (refer to FIG. 1) in the first mode may expose the first area AA1 and a portion of the second area AA2 of the display surface DS, and the third area NAA may not be exposed through the opening OP (refer to FIG. 1) of the case CS (refer to FIG. 1). However, this is merely an example, and the disclosure should not be limited thereto or thereby. Although not shown in the drawings, the first area AA1 may be exposed through the opening OP (refer to FIG. 1) in the first mode, and the second area AA2 may not be exposed through the opening OP (refer to FIG. 1) in the first mode.

In case that the display device DD operates in the second mode, the second area AA2 may be more exposed to the outside through the opening OP (refer to FIG. 1) of the case CS (refer to FIG. 1). For example, the screen size of the display device DD may increase by the area of the more exposed portion of the second area AA2.

The third area NAA may be adjacent to the second area AA2. For example, the second area AA2 may be defined between the first area AA1 and the third area NAA. The third area NAA may be a non-effective area that is not used as the screen of the display device DD.

The support plate SP may be disposed under the display module DM. The support plate SP may include a material having a higher rigidity than that of the display module DM. As an example, the support plate SP may include a metal material such as aluminum. The support plate SP may include the first support portion SP1, the support bars SB, and the second support portion SP2. The first support portion SP1 may support the first area AA1 of the display module DM, and the support bars SB may support the second area AA2 of the display module DM. The second support portion SP2 may support the third area NAA of the display module DM.

The support bars SB may be disposed between the first support portion SP1 and the second support portion SP2. The support bars SB may extend in the second direction DR2 and may be arranged in the first direction DR1. The support bars SB adjacent to each other may be spaced apart from each other in the first direction DR1. When viewed in the second direction DR2, each of the support bars SB may have an inverted trapezoidal shape with respect to the display surface DS of the display module DM.

In the embodiment, the support bars SB spaced apart from each other in first direction DR1 are shown, but the structure of the support bars SB should not be limited thereto. For example, although not shown in the drawings, the support bars SB may be implemented in a joint structure in which the support bars SB are connected to each other to be rotated.

The first support portion SP1 may include a surface substantially parallel to a surface defined by the first direction DR1 and the second direction DR2. The first support portion SP1 may have a size corresponding to the first area AA1 of the display module DM.

The second support portion SP2 may extend in the second direction DR2. The second support portion SP2 may have a rectangular shape having long sides extending in the second direction DR2 and short sides extending in the first direction DR1. The second support portion SP2 may have a size corresponding to the third area NAA of the display module DM.

The support film SFL may be disposed between the display module DM and the support plate SP. The support film SFL may be an elastomer layer having superior elasticity and shape-restoration force but is not limited thereto.

The foam layer FL may be disposed between the support film SFL and the display module DM. The foam layer FL may support the display module DM and may alleviate a flexure on the display module DM so that the flexure is not viewed. The foam layer FL will be described in detail with reference to FIG. 7B.

Figure 7A:
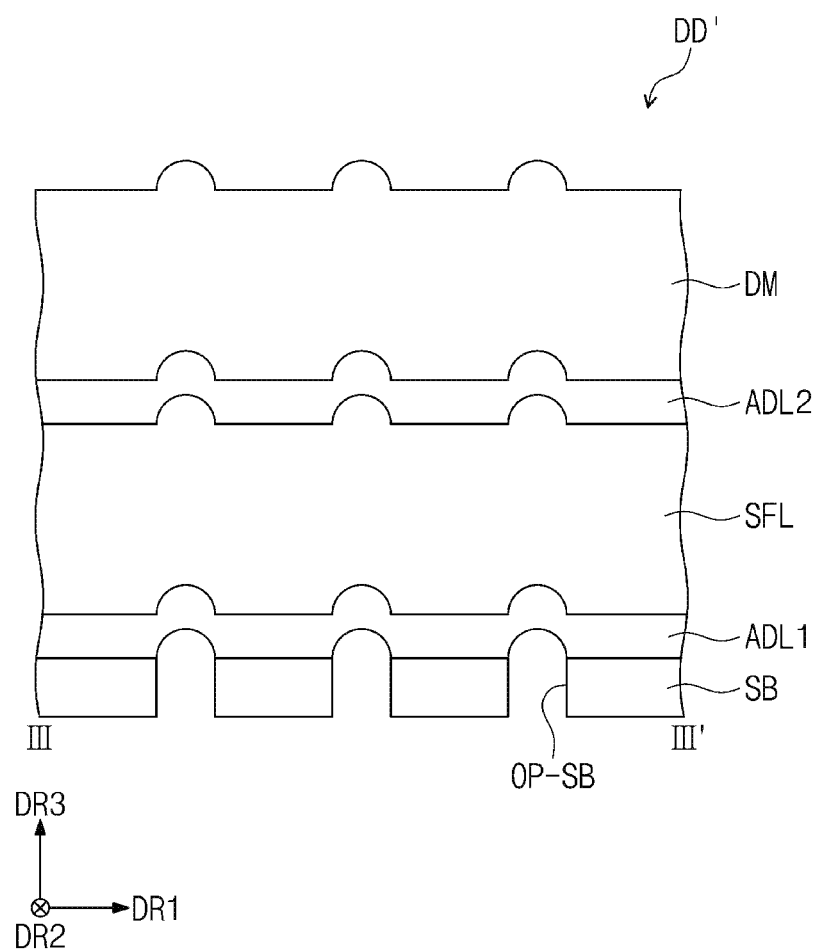
FIG. 7A is a schematic cross-sectional view showing a portion of a display device according to a comparative example.
Figure 7B:
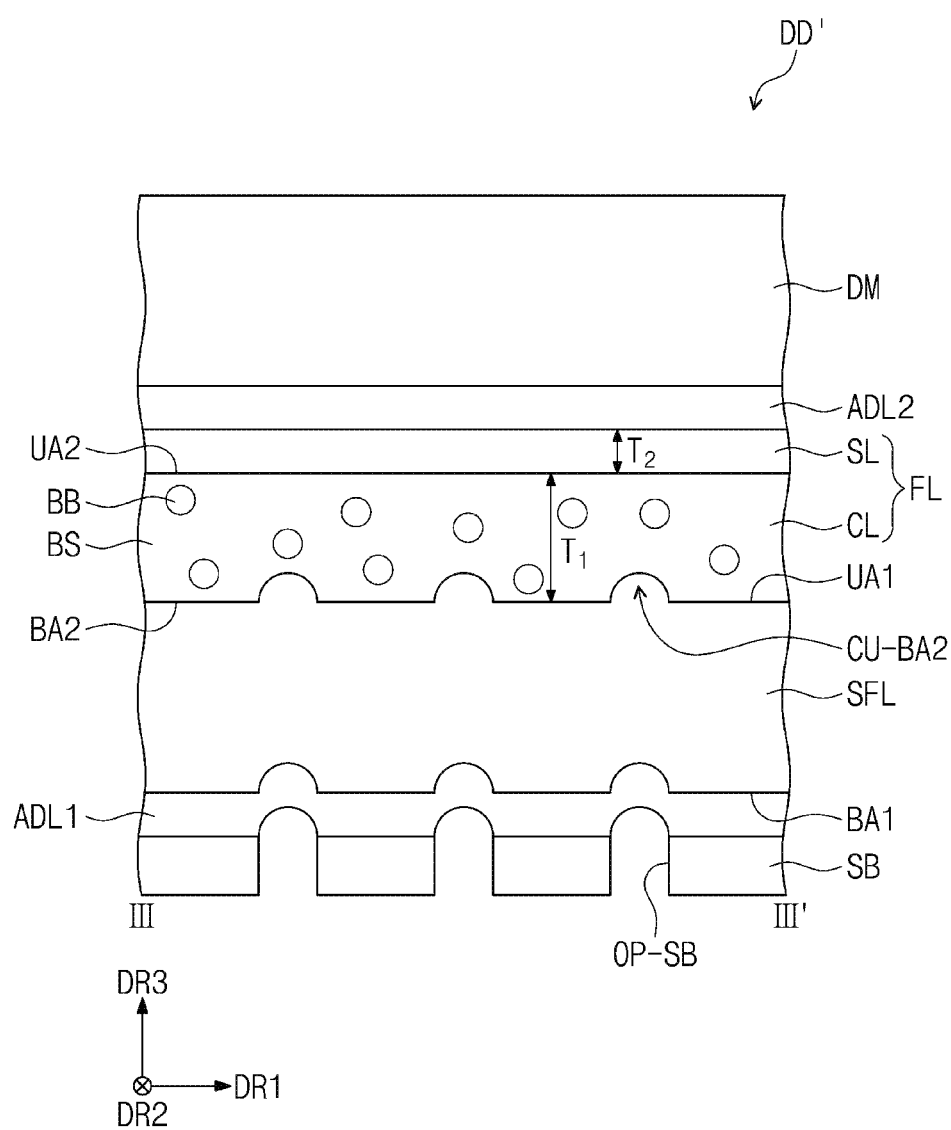
FIGS. 7B, 8, and 9 are schematic cross-sectional views respectively showing portions of display devices according to embodiments.
Figure 8:
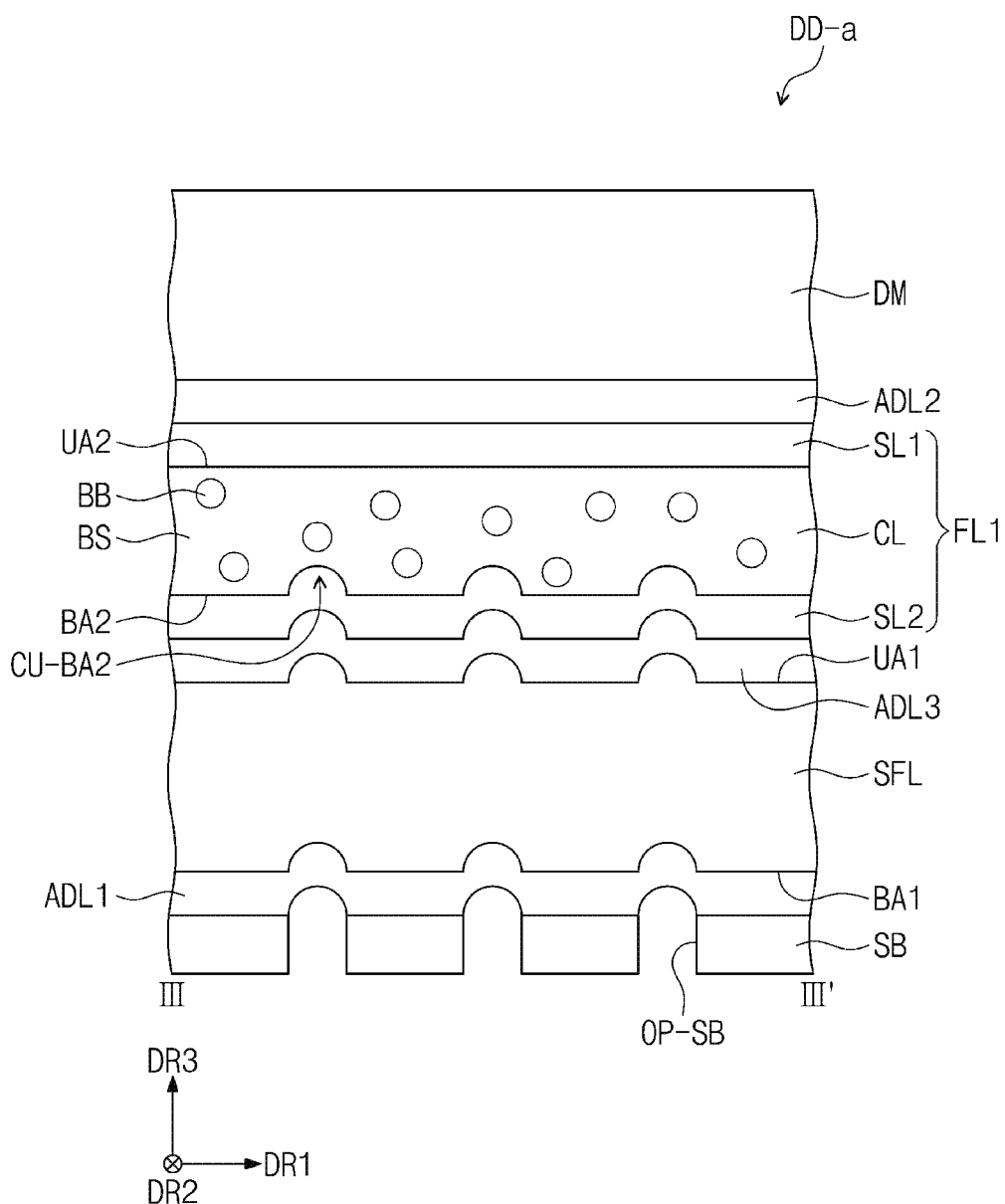
Figure 9:
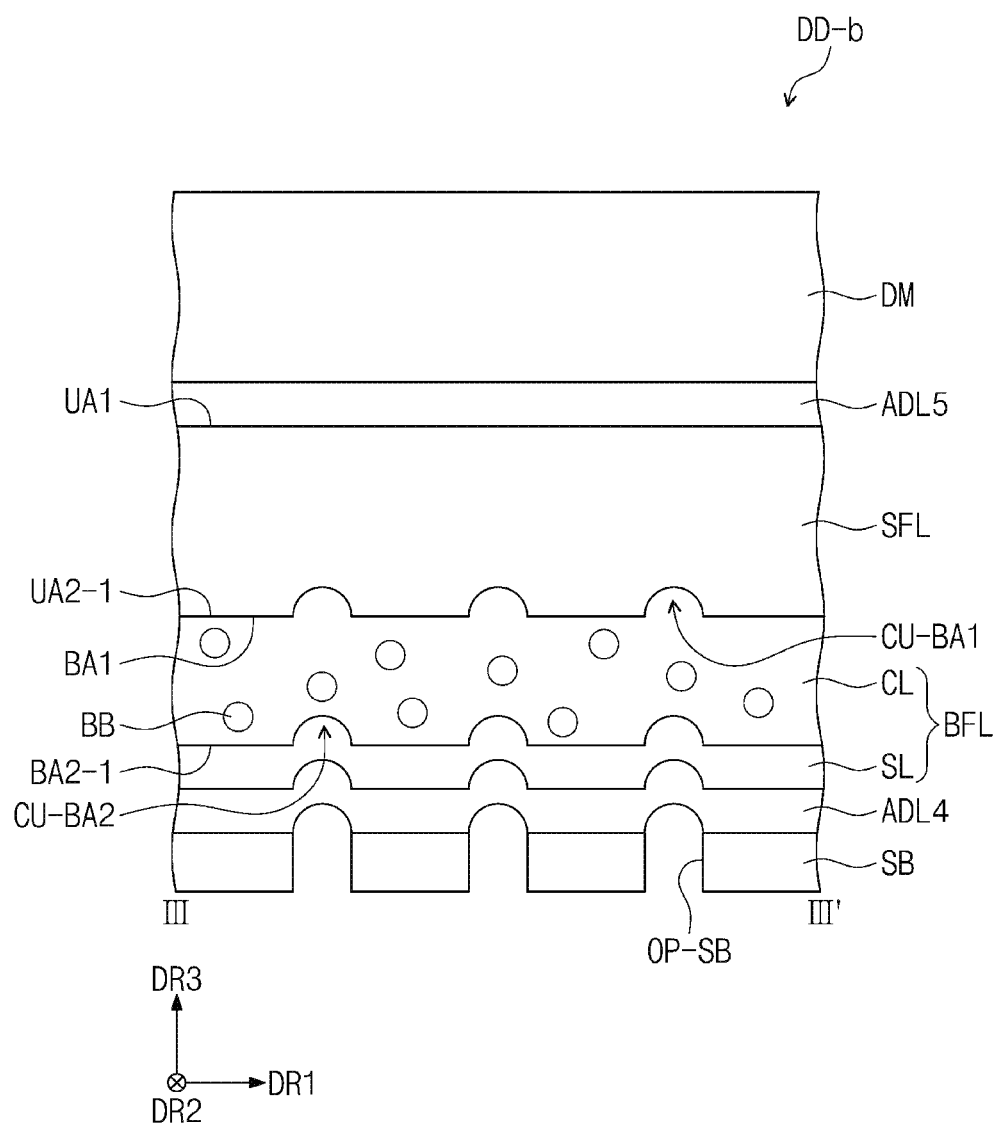

FIG. 7A is a schematic cross-sectional view showing a portion of a display device DD' according to a comparative example. FIGS. 7B, 8, and 9 are schematic cross-sectional views respectively showing portions of display devices DD', DD-a, and DD-b according to embodiments.

Referring to FIG. 7A, the display device DD' of the comparative example may include a display module DM, support bars SB disposed under the display module DM, and a support film SFL disposed between the support bars SB and the display module DM. An opening OP-SB may be defined between the support bars SB adjacent to each other, and the flexure may be viewed in an area of the display module DM, which overlaps the opening OP-SB.

Referring to FIG. 7B, unlike the display device DD' of the comparative example, the display device DD' may further include the foam layer FL disposed between the support film SFL and the display module DM. For example, the foam layer FL may be disposed on a first upper surface UA1 of the support film SFL among the first upper surface UA1 and a first lower surface BA1 of the support film SFL. Since the display device DD' according to the embodiment further includes the foam layer FL, the flexure may not be viewed in the area of the display module DM overlapping the opening OP-SB.

The foam layer FL may include a core layer CL and an upper skin layer SL disposed on a second upper surface UA2 of the core layer CL among the second upper surface UA2 and a second lower surface BA2 of the core layer CL. The core layer CL may have a first modulus, and the upper skin layer SL may have a second modulus greater than the first modulus. The core layer CL may have a small modulus value due to the characteristics of its material, and thus it is disadvantageous that peeling occurs in the core layer CL. Accordingly, in case that the upper skin layer SL having a large modulus is disposed on the second upper surface UA2, the effect of stretching the core layer CL may increase, and the peeling of the core layer CL may be prevented. The second modulus may be equal to or greater than about 20 Mpa and equal to or smaller than about 24 Mpa (or in a range of about 20 Mpa to about 24 Mpa) at a temperature of about −20° C., and a modulus of the foam layer FL may be equal to or greater than about 3 Mpa and equal to or smaller than about 4 Mpa at a temperature of about −20° C.

The core layer CL may have a first thickness $T_1$, and the upper skin layer SL may have a second thickness $T_2$. A ratio of the first thickness $T_1$ to the second thickness $T_2$ may be in a range of about 10:1 to about 34:1. The first thickness $T_1$ may be equal to or greater than about 80 μm and equal to or smaller than about 100 μm. The second thickness $T_2$ may be equal to or greater than about 3 μm and equal to or smaller than about 8 μm.

The core layer CL may include a base resin BS and pores BB defined in the base resin BS. As the core layer CL includes the pores BB, the core layer CL may have a density equal to or greater than about 0.5 g/cm$^3$ and equal to or smaller than about 0.8 g/cm$^3$. As the core layer CL has the density equal to or greater than about 0.5 g/cm$^3$ and equal to or smaller than about 0.8 g/cm$^3$, the core layer CL may have the superior restoration force against deformation caused by external force, and thus, the core layer CL may maintain a flat state even though it is pressed by the support bars SB.

A first adhesive layer ADL1 may be disposed between the support film SFL and the support bars SB and may affix the support bars SB to the support film SFL. A second adhesive layer ADL2 may be disposed between the foam layer FL and the display module DM to attach the foam layer FL to the display module DM. However, this is merely an example, and the disclosure should not be limited thereto. The support film SFL may be disposed directly on the support bars SB without employing the first adhesive layer ADL1, and the display module DM may be disposed directly on the foam layer FL without employing the second adhesive layer ADL2.

Hereinafter, the display device DD-a will be described in detail with reference to FIG. 8. In FIG. 8, descriptions of the same elements as those of FIGS. 1 to 7B will be omitted, and different features from those of FIGS. 1 to 7B will be mainly described. Unlike the display device DD shown in FIG. 7B, the display device DD-a shown in FIG. 8 may further include a second skin layer SL2 disposed on a second lower surface BA2 of a core layer CL and a third adhesive layer ADL3 disposed between a support film SFL and a foam layer FL1.

Referring to FIG. 8, the foam layer FL1 of the display device DD-a according to the embodiment may include a first skin layer SL1 disposed on a second upper surface UA2 of the core layer CL and the second skin layer SL2 disposed on the second lower surface BA2.

The display device DD-a may include the third adhesive layer ADL3 disposed between the foam layer FL1 and the support film SFL. However, this is merely an example, and the disclosure should not be limited thereto. Although not shown in the drawings, the foam layer FL1 may be disposed directly on the support film SFL in the display device DD-a.

Hereinafter, the display device DD-b will be described in detail with reference to FIG. 9. In FIG. 9, descriptions of the same elements as those of FIGS. 1 to 7B will be omitted, and different features from those of FIGS. 1 to 7B will be mainly described. Unlike the display device DD shown in FIG. 7B, a foam layer BFL may be disposed under the support film SFL in the display device DD-b shown in FIG. 9.

Referring to FIG. 9, the foam layer BFL of the display device DD-b may be disposed on a first lower surface BA1 of the support film SFL. The display device DD-b may include a fourth adhesive layer ADL4 disposed between the foam layer BFL and support bars SB and a fifth adhesive layer ADL5 disposed between the support film SFL and a display module DM.

The foam layer BFL may be provided with a concave portion CU-BA2 recessed toward the display module DM in a portion where a second lower surface BA2-1 overlaps an opening OP-SB, and a convex portion (not shown) protruding toward the display module DM in a portion where a second upper surface UA2-1 overlaps the opening OP-SB. A concave portion CU-BA1 recessed toward the display module DM may be defined in the first lower surface BA1 of the support film SFL, and the concave portion CU-BA1 may correspond to the convex portion (not shown). In a first upper surface UA1 of the support film SFL, a portion overlapping the concave portion CU-BA2 may be a flat surface.

For example, the display devices DD, DD-a, and DD-b according to the embodiments described with reference to FIGS. 7B to 9 may include the support film SFL disposed between the display module DM and the support bars SB and the foam layers FL and BFL disposed on the first upper surface UA1 or the first lower surface BA1 of the support film SFL. Although not shown in the drawings, the display device DD according to the embodiment may include foam layers FL disposed on both the first upper surface UA1 and the first lower surface BA1 of the support film SFL.

The foam layers FL and BFL may include the skin layer SL disposed on at least one of the second upper surface UA2 and the second lower surface BA2 of the core layer CL. In case that the skin layer SL is disposed on a surface of the second upper surface UA2 and the second lower surface BA2 of the core layer CL and the support film SFL is disposed on the other surface of the second upper surface UA2 and the second lower surface BA2 of the core layer CL, the support film SFL may serve as the skin layer SL.

Figure 10A:
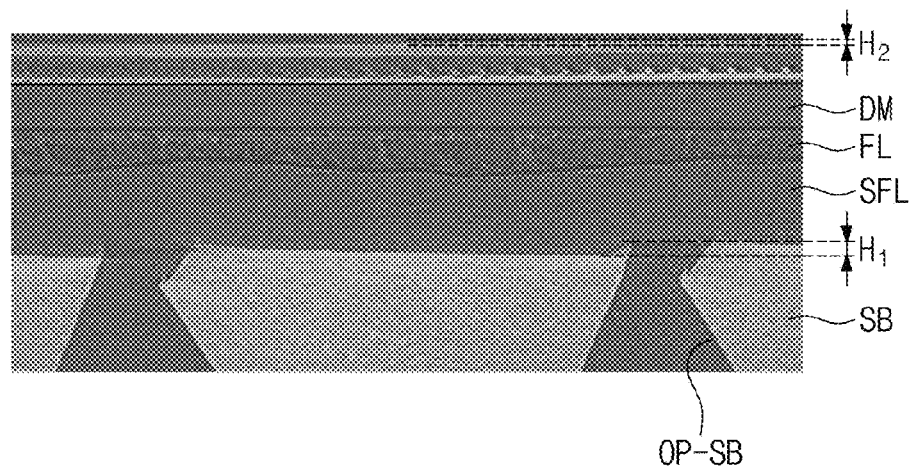
FIG. 10A is an image produced by an X-ray microscope to show a schematic cross-section of a display device according to an embodiment of the disclosure.
Figure 10B:
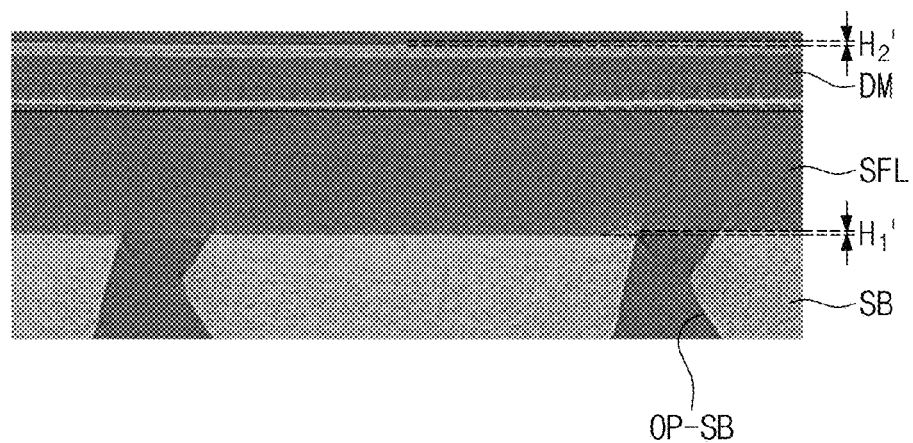
FIG. 10B is an image produced by an X-ray microscope to show a schematic cross-section of a display device according to a comparative example.

FIG. 10A is an image produced by an X-ray microscope (XRM) to show a schematic cross-section of the display device DD according to an embodiment, and FIG. 10B is an image produced by an X-ray microscope to show a schematic cross-section of the display device DD' according to the comparative example.

Referring to FIG. 10A, unlike the display device DD' of the comparative example, the display device DD according to the embodiment may include the foam layer FL disposed between the support film SFL and the display module DM. In the area overlapping the opening OP-SB defined between the support bars SB of the display device DD, a height $H_2$ of a flexure on a surface of the display module DM may be smaller than a height $H_1$ of a flexure on the support film SFL. Accordingly, as the display device DD includes the foam layer FL, it may be seen that the flexure on the surface of the display module DM is reduced.

Referring to FIG. 10B, in an area overlapping the opening OP-SB defined between the support bars SB of the display device DD' according to the comparative example, a height $H_1'$ of a flexure on the support film SFL may be substantially equal to a height $H_2'$ of a flexure of a surface of the display module DM, and as a result, the flexure on the display module DM may be viewed as it is.

Hereinafter, the disclosure will be described in more detail with reference to a specific example and a comparative example. The following example is intended only to aid understanding of the disclosure, and the scope of the disclosure should not be limited thereto.

The following Table 1 shows thicknesses of layers stacked in the display devices according to the comparative example and an embodiment example. The following Table 2 shows a segmental perception index Kc of display modules included in the display devices according to the comparative example and the embodiment example. The segmental perception index Kc is measured using surface quality measuring equipment (Optimap). The surface quality measuring equipment is used to measure the segmental perception index Kc. In case that the segmental perception index Kc is equal to or greater than about 0.80, it means that the flexure is viewed with the naked eye, and in case that the segmental perception index Kc is smaller than about 0.80, it means that the flexure is not viewed with the naked eye.

TABLE 1

|  | Comparative example | Embodiment example |
|---|---|---|
| Display module (μm) | 312 | 314 |
| Core layer (μm) | 0 | 94 |
| Upper skin layer (μm) | 0 | 3 |
| Lower skin layer (μm) | 0 | 3 |
| Support film (μm) | 100 | 100 |

TABLE 2

|  | Comparative example | | Embodiment example | |
|---|---|---|---|---|
| Kc (segmental perception index) | Initial stage | 60° C., 93% reliability after 24 hours of test | Initial stage | 60° C., 93% reliability after 24 hours of test |
|  | 0.95 | 1.35 | 0.39 | 0.76 |

Figure 11A:
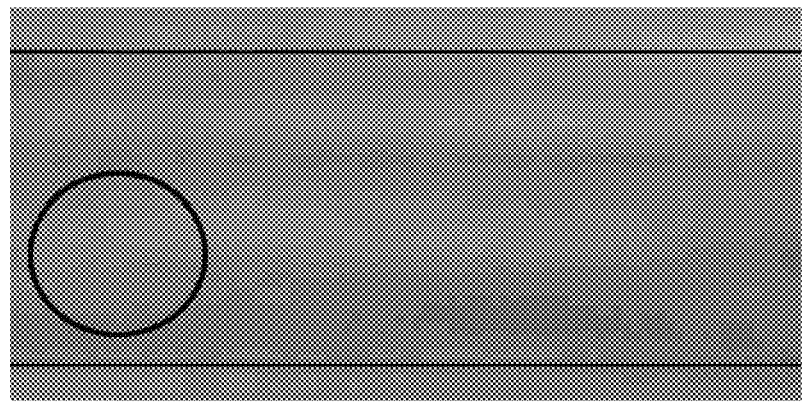
FIG. 11A is an image showing a surface of a display module of a display device according to an embodiment of the disclosure.
Figure 11B:
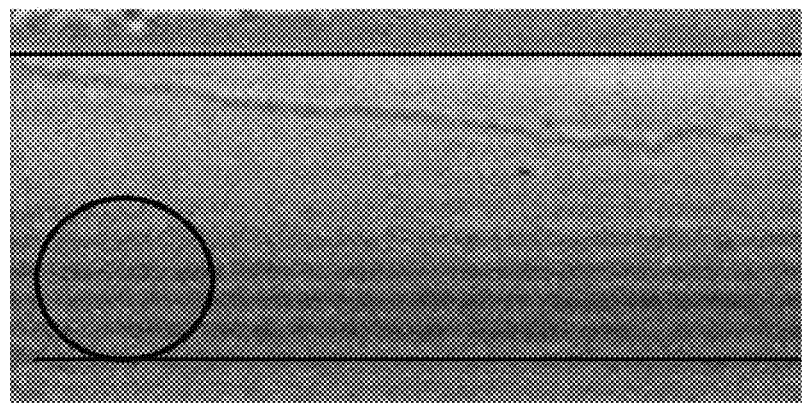
FIG. 11B is an image showing a surface of a display module of a display device according to a comparative example.

The display device of the comparative example has a segmental perception index Kc of about 0.95 at an initial stage and has a segmental perception index Kc of about 1.35 after 24 hours of about 93% reliability test at about 60° C. according to the measured results with the surface quality measuring equipment. The display device according to the embodiment example has a segmental perception index Kc of about 0.39 at the initial stage and has a segmental perception index Kc of about 0.76 after 24 hours of about 93% reliability test at about 60° C. according to the measured results with the surface quality measuring equipment. When comparing the segmental perception index of the comparative example with the segmental perception index of the embodiment example, it is seen that the flexure on the surface of the display module is not viewed from the outside since the display device according to the example embodiment includes the foam layer including the core layer and the skin layer. FIG. 11A is an image showing the surface of the display module of the display device according to the example embodiment, and FIG. 11B is an image showing the surface of the display module of the display device according to the comparative example. The surfaces of the display modules shown in FIGS. 11A and 11B are photographed by using a 3D XRM (3D X-ray Microscopes). Referring to FIGS. 11A and 11B, it can be seen that the flexure on the surface of the display module of the display device of the comparative example is viewed, but the flexure on the surface of the display module of the display device according to the example embodiment is not viewed.

As the display device includes the foam layer disposed between the display module and the support bars, the flexure viewed from the outside in the area of the display module overlapping the support bars may be reduced, and thus, the surface quality of the display module may be improved.

Although some embodiments of the disclosure have been described, it is understood that the disclosure should not be limited to these embodiments but various changes and modifications can be made by one ordinary skilled in the art within the spirit and scope of the disclosure. Therefore, the disclosed subject matter should not be limited to any single embodiment described herein, and the scope of the claimed invention shall be determined according to the attached claims.

What is claimed is:

1. A display device, comprising:
a display module;
a support plate disposed under the display module, the support plate comprising:
a plurality of support bars;
an opening defined between the plurality of support bars adjacent to each other; and
a first support portion and a second support portion spaced apart from each other, the plurality of support bars being disposed between the first support portion and the second support portion;
a support film disposed between the display module and the support plate; and
a foam layer disposed on at least one of a first upper surface and a first lower surface of the support film, the foam layer comprising:
a core layer having a first modulus of elasticity and a first thickness; and
a skin layer disposed on at least one of a second upper surface and a second lower surface of the core layer, having a second modulus of elasticity greater than the first modulus of elasticity, and having a second thickness smaller than the first thickness,
wherein a ratio of the first thickness to the second thickness is in a range of about 10:1 to about 35:1.

2. The display device of claim 1, wherein
the foam layer is disposed on the support film,
the core layer comprises a concave portion defined in the second lower surface to overlap the opening and recessed toward the display module, and
the second upper surface is a flat surface.

3. The display device of claim 2, further comprising:
a first adhesive layer disposed between the support plate and the support film; and
a second adhesive layer disposed between the foam layer and the display module.

4. The display device of claim 3, wherein the first adhesive layer comprises a concave portion overlapping the opening and recessed toward the display module.

5. The display device of claim 3, wherein the foam layer is disposed directly on the support film.

6. The display device of claim 1, wherein
the foam layer is disposed under the support film,
each of the second upper surface and the second lower surface comprises a concave defined therein, portion overlapping the opening and recessed toward the display module,
the first lower surface comprises a concave portion defined therein, overlapping the opening and recessed toward the display module, and
the first upper surface is a flat surface.

7. The display device of claim 6, further comprising:
a fourth adhesive layer disposed between the support film and the display module; and
a fifth adhesive layer disposed between the foam layer and the plurality of support bars.

8. The display device of claim 1, wherein the first thickness is equal to or greater than about 80 μm and equal to or smaller than about 100 μm.

9. The display device of claim 1, wherein the second thickness is equal to or greater than about 3 μm and equal to or smaller than about 8 μm.

10. The display device of claim 1, wherein the core layer has a density equal to or greater than about 0.5 g/cm³ and equal to or smaller than about 0.8 g/cm³.

11. The display device of claim 1, wherein the second modulus of elasticity is equal to or greater than about 20 Mpa and equal to or smaller than about 24 Mpa at a temperature of about −20° C.

12. The display device of claim 1, wherein the foam layer has a modulus of elasticity that is equal to or greater than about 3 Mpa and equal to or smaller than about 5 Mpa at a temperature of about −20° C.

13. The display device of claim 1, wherein the core layer comprises a base resin comprising a plurality of pores defined therein.

14. The display device of claim 1, wherein
the core layer comprises polyurethane, and
the skin layer comprises polyolefin.

15. A display device, comprising:
a display module;
a support plate disposed under the display module, the support plate comprising:
a plurality of support bars spaced apart from each other; and
a first support portion and a second support portion spaced apart from each other, the plurality of support bars being disposed between the first support portion and the second support portion;
a support film disposed between the display module and the support plate; and
a foam layer disposed on at least one of a first upper surface and a first lower surface of the support film, having a first modulus of elasticity, and having a first thickness, the foam layer comprising:
a core layer; and
an upper skin layer disposed on at least one of a second upper surface and a second lower surface of the core layer, having a second modulus of elasticity greater than the first modulus of elasticity, and having a second thickness smaller than the first thickness, wherein
a ratio of the first thickness to the second thickness is in a range of about 10:1 to about 35:1,
the display device is operated in a first mode or a second mode, and
a display surface of the display device in the second mode is larger than in the first mode.

16. The display device of claim 15, wherein the display module comprises:
a first area overlapping the first support portion;

a second area overlapping the plurality of support bars;
a third area overlapping the second support portion, and
a size of the second area exposed to an outside increases in case that the first mode is changed to the second mode.

17. The display device of claim 15, wherein the second modulus of elasticity is equal to or greater than about 20 Mpa and equal to or smaller than about 24 Mpa at a temperature of about −20° C.

18. The display device of claim 15, wherein the foam layer has a modulus of elasticity that is equal to or greater than about 3 Mpa and equal to or smaller than about 5 Mpa at a temperature of about −20° C.

19. The display device of claim 15, wherein
the core layer comprises polyurethane, and
the skin layer comprises polyolefin.

20. The display device of claim 15, wherein
the first thickness is equal to or greater than about 80 μm and equal to or smaller than about 100 μm, and the second thickness is equal to or greater than about 3 μm and equal to or smaller than about 8 μm.

* * * * *